(12) United States Patent  
Chen et al.

(10) Patent No.: US 12,400,908 B2  
(45) Date of Patent: Aug. 26, 2025

(54) EPITAXIAL GROWTH METHOD FOR FDSOI HYBRID REGION

(71) Applicant: Shanghai Huali Integrated Circuit Corporation, Shanghai (CN)

(72) Inventors: Yongyue Chen, Shanghai (CN); Qiang Yan, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 307 days.

(21) Appl. No.: 17/836,180

(22) Filed: Jun. 9, 2022

(65) Prior Publication Data

US 2022/0415707 A1 Dec. 29, 2022

(30) Foreign Application Priority Data

Jun. 29, 2021 (CN) .......................... 202110723559.7

(51) Int. Cl.
*H01L 21/762* (2006.01)
*H01L 21/02* (2006.01)
*H01L 21/768* (2006.01)

(52) U.S. Cl.
CPC .. *H01L 21/76243* (2013.01); *H01L 21/02532* (2013.01); *H01L 21/76895* (2013.01); *H01L 21/76898* (2013.01)

(58) Field of Classification Search
CPC ................ H01L 21/84; H01L 27/1207; H01L 21/76264; H01L 21/70; H01L 21/76; H01L 21/762; H01L 27/02; H01L 27/12; H01L 27/1203–1211; H01L 21/7624–76291; H01L 29/7812; H01L 29/7824; H10D 86/201; H10D 87/00

See application file for complete search history.

(56) References Cited

U.S. PATENT DOCUMENTS

| | | | | |
|---|---|---|---|---|
| 5,476,809 | A * | 12/1995 | Kobayashi | ........ H01L 21/76264 148/DIG. 12 |
| 2003/0057487 | A1* | 3/2003 | Yamada | ............ H01L 21/76264 438/149 |
| 2006/0284250 | A1* | 12/2006 | Hsu | ........................ H01L 21/84 257/E29.004 |
| 2008/0265362 | A1* | 10/2008 | Tigelaar | ............... H10D 86/201 257/504 |
| 2010/0327397 | A1* | 12/2010 | Nakai | ............... H01L 21/76243 438/480 |
| 2022/0310443 | A1* | 9/2022 | Guan | ................ H01L 21/76272 |

* cited by examiner

*Primary Examiner* — Julio J Maldonado
*Assistant Examiner* — Stanetta D Isaac
(74) *Attorney, Agent, or Firm* — Banner & Witcoff, Ltd.

(57) ABSTRACT

The present application discloses an epitaxial growth method for an FDSOI hybrid region, comprising: step 1, providing an FDSOI substrate structure, and forming a hard mask layer; step 2, forming a trench in the entire hybrid region, wherein the bottom surface of the trench is below or level with the top surface of the semiconductor body layer; step 3, performing oxidation to form a first oxide layer on the exposed surfaces of the semiconductor body layer and the semiconductor top layer; step 4, fully etching the first oxide layer, and forming an inner sidewall composed of the remaining first oxide layer on the side surface of the trench in a self-aligned manner; and step 5, performing epitaxial growth to form, in the trench, a semiconductor epitaxial layer in contact with the semiconductor body layer.

13 Claims, 3 Drawing Sheets

EPITAXIAL GROWTH METHOD FOR FDSOI HYBRID REGION

CROSS-REFERENCES TO RELATED APPLICATIONS

This application claims priority to Chinese Patent Application No. 202110723559.7, filed on Jun. 29, 2021, the disclosure of which is incorporated herein by reference in its entirety.

TECHNICAL FIELD

The present application relates to a method for manufacturing a semiconductor integrated circuit, in particular to an epitaxial growth method for a fully depleted semiconductor on insulator (FDSOI) hybrid region.

BACKGROUND

With the continuous and rapid development of integrated circuits, the key dimensions of devices in the circuits continue to shrink, and the film thickness of corresponding components also continue to shrink. FDSOI becomes a choice to overcome the short channel effect, and the requirements for defects in the manufacturing process become increasing higher, finally achieving zero tolerance for defects.

In the FDSOI process, a substrate structure includes a semiconductor body layer, a dielectric buried layer, and a semiconductor top layer. The dielectric buried layer is formed on the surface of the semiconductor body layer, and the semiconductor top layer is formed on the surface of the dielectric buried layer. Generally, the semiconductor body layer and the semiconductor top layer are made of Si. The semiconductor top layer is generally referred to as a SOI layer, and the semiconductor top layer has an ultra-thin structure. An ultra-thin transistor can be obtained by using the ultra-thin semiconductor top layer to form a semiconductor device, so as to well control the short channel effect of the transistor, thereby reducing the supply voltage.

In the FDSOI process, in addition to the ultra-thin transistor such as a CMOS device formed in the semiconductor top layer, it is sometimes necessary to form a passive device and a pickup structure in contact with the bottom semiconductor body layer. In order to form the passive device and pickup structure in contact with the bottom semiconductor body layer, semiconductor epitaxial silicon that is in direct contact with the bottom semiconductor body layer and has a top surface being level with the top surface of the semiconductor top layer needs to be formed in the FDSOI. Accordingly, it is necessary to separately define a hybrid region, so as to form a semiconductor epitaxial layer in direct contact with the semiconductor body layer. In an existing epitaxial growth method for an FDSOI hybrid region, due to the properties of the epitaxial process, in the process of semiconductor epitaxial growth, such as silicon epitaxial growth, additional epitaxy may occur in the semiconductor top layer at the boundary between the hybrid region and a SOI region outside the hybrid region, disturbing a growth mode of the semiconductor epitaxial layer in the hybrid region and thereby forming a protrusion defect at the boundary. Improvements to the growth process can reduce such the defect to an acceptable degree, but cannot completely eliminate the defect.

FIG. 1 is a schematic diagram of a device structure obtained after the existing epitaxial growth method for an FDSOI hybrid region is completed. An FDSOI substrate includes a semiconductor body layer 101, a dielectric buried layer 102, and a semiconductor top layer 103. In order to define a hybrid region, a hard mask layer 104 is formed on the top of the semiconductor top layer 103. Then, the hybrid region is opened by means of a photolithography process, and the hard mask layer 104, the semiconductor top layer 103, and the dielectric buried layer 102 in the hybrid region are etched to form a trench. The bottom surface 1051 of the trench needs to ensure that the surface of the semiconductor body layer 101 is exposed. After that, a semiconductor epitaxial layer 106 is formed on the surface of the exposed semiconductor body layer 101. However, in the process of growing the semiconductor epitaxial layer 106, an epitaxial layer also grows in the semiconductor top layer 103 exposed at the side surface 1052 of the trench, thereby disturbing the growth of the entire semiconductor epitaxial layer 106 and eventually forming a protrusion defect 1061.

BRIEF SUMMARY

According to some embodiments in this application, the epitaxial growth method for an FDSOI hybrid region provided by the present application includes the following steps:

step 1, providing an FDSOI substrate structure, the FDSOI substrate including a semiconductor body layer, a dielectric buried layer, and a semiconductor top layer, the dielectric buried layer being formed on the surface of the semiconductor body layer, the semiconductor top layer being formed on the surface of the dielectric buried layer; and forming a hard mask layer on the surface of the semiconductor top layer;

step 2, forming a trench in the entire hybrid region, wherein the hard mask layer, the semiconductor top layer, and the dielectric buried layer in the trench are completely removed, the bottom surface of the trench is below or level with the top surface of the semiconductor body layer and exposes the surface of the semiconductor body layer, and the side surface of the trench exposes the hard mask layer, the semiconductor top layer, the dielectric buried layer, and the semiconductor body layer within the depth range of the trench;

step 3, performing oxidation to form a first oxide layer on the exposed surfaces of the semiconductor body layer and the semiconductor top layer;

step 4, fully etching the first oxide layer to completely remove the first oxide layer on the bottom surface of the trench, and forming an inner sidewall composed of the remaining first oxide layer on the side surface of the trench in a self-aligned manner; and step 5, performing epitaxial growth to form, in the trench, a semiconductor epitaxial layer in contact with the semiconductor body layer.

In some cases, the material of the semiconductor body layer includes silicon or germanium.

In some cases, the material of the dielectric buried layer includes silicon oxide or a high dielectric constant material.

In some cases, the material of the semiconductor top layer includes silicon or germanium.

In some cases, the material of the semiconductor epitaxial layer includes silicon or germanium.

In some cases, the hard mask layer is formed by superimposing a first silicon oxide layer and a second silicon nitride layer.

In some cases, in step 2, the hybrid region is defined by means of a photolithography process, the trench is formed by means of an etching process, the etching process of the trench completely removes the hard mask layer, the semiconductor top layer, and the dielectric buried layer in the hybrid region, and the etching process of the trench does not etch or partially etches the semiconductor body layer.

In some cases, in step 3, the thickness of the formed first oxide layer is 10 Å-20 Å.

In some cases, the thickness of the semiconductor top layer is less than 12 nm.

In some cases, in step 4, the first oxide layer is fully etched by means of a dry etching process.

In some cases, after the epitaxial growth in step 5 is completed, the top surface of the semiconductor epitaxial layer is level with the top surface of the semiconductor top layer.

In some cases, in step 5, the epitaxial growth of the semiconductor epitaxial layer is performed by means of an RPCVD process.

In some cases, the surface of the semiconductor epitaxial layer in the hybrid region is used to form a passive device or a pickup structure that needs to be connected to the semiconductor body layer.

In some cases, the semiconductor top layer outside the hybrid region is used to form a CMOS device.

In some cases, the CMOS device includes a PMOS device and an NMOS device.

In the present application, before the formation of the trench in the hybrid region and the epitaxial growth, an added oxidation process and a full etching process for the first oxide layer formed by the oxidation form the inner sidewall on the side surface of the trench. The inner sidewall can eliminate the growth of an epitaxial layer from the side surface of the semiconductor top layer exposed in the trench, so as to ensure that the epitaxial growth occurs strictly from bottom to top, thereby eliminating a protrusion defect in the semiconductor epitaxial layer at the boundary of the hybrid region and eventually improving the flatness of the surface of the semiconductor epitaxial layer.

In addition, the oxidation process oxidizes only the exposed semiconductor layers, so that the first oxide layer can be formed on the surfaces of the semiconductor top layer and the semiconductor body layer in a self-aligned manner and the thickness of the first oxide layer can be controlled to be very thin. In this case, the formed inner sidewall does not occupy an additional space and thus does not change the morphology of the semiconductor epitaxial layer, so that a bottom-to-top growth mode of the epitaxial growth is not affected. Therefore, the formation process for the inner sidewall of the present application does not produce new adverse effects on the epitaxial growth, eventually improving the overall process.

BRIEF DESCRIPTION OF THE DRAWINGS

The present application is described in detail below with reference to the drawings and specific implementations.

DETAILED DESCRIPTION OF THE DISCLOSURE

Figure 1:
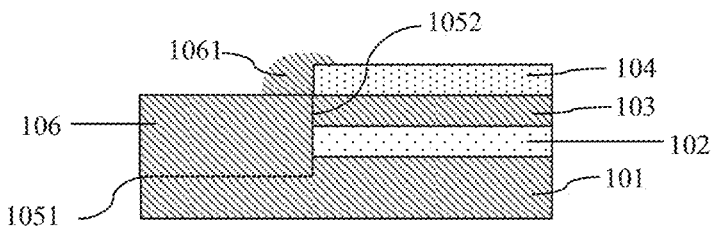
FIG. 1 is a schematic diagram of a device structure obtained after an existing epitaxial growth method for an FDSOI hybrid region is completed.
Figure 2:
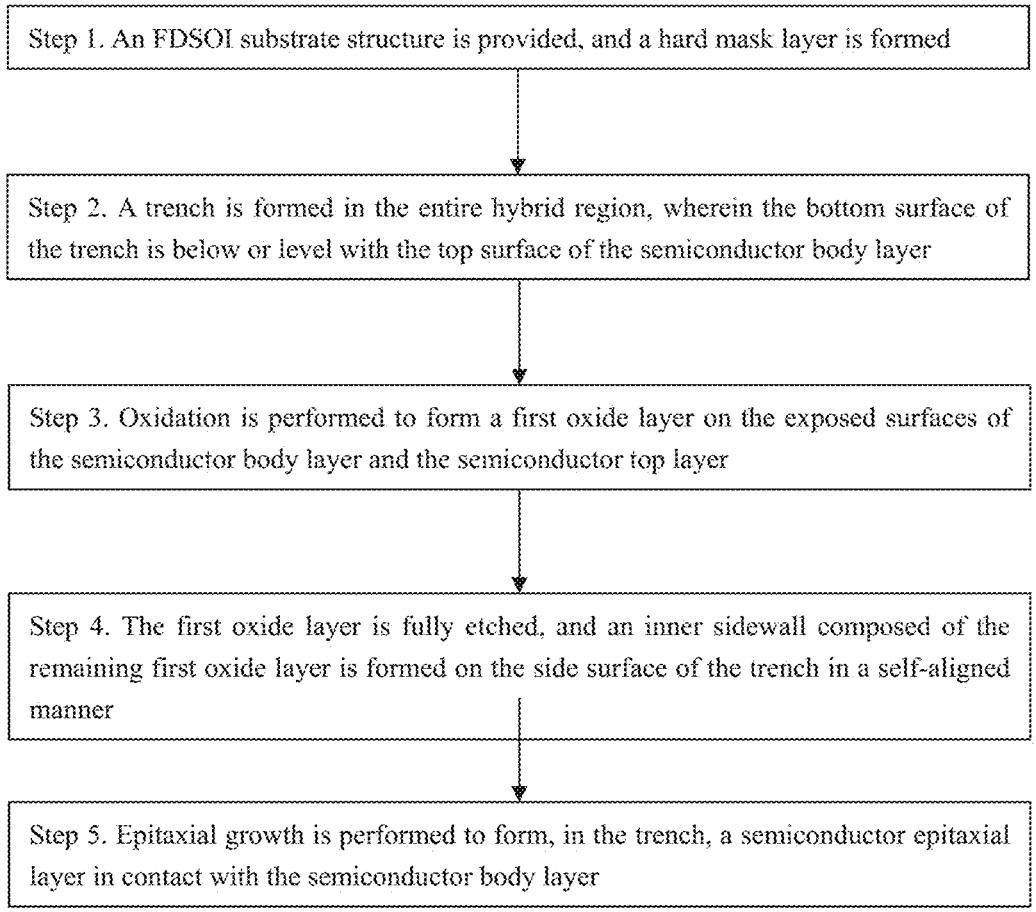
FIG. 2 is a flowchart of an epitaxial growth method for an FDSOI hybrid region according to an embodiment of the present application.
Figure 3A:
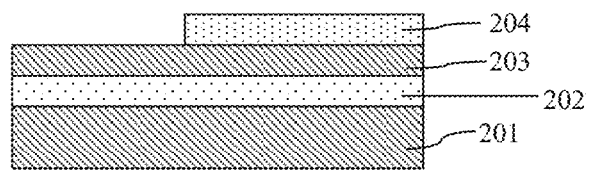
FIGS. 3A-3E are schematic diagrams of device structures in steps of the epitaxial growth method for an FDSOI hybrid region according to an embodiment of the present application.

FIG. 2 is a flowchart of an epitaxial growth method for an FDSOI hybrid region according to an embodiment of the present application. FIGS. 3A-3E are schematic diagrams of device structures in steps of the epitaxial growth method for an FDSOI hybrid region according to an embodiment of the present application. The epitaxial growth method for an FDSOI hybrid region according to this embodiment of the present application includes the following steps:

Step 1. Referring to FIG. 3A, an FDSOI substrate structure is provided, the FDSOI substrate including a semiconductor body layer 201, a dielectric buried layer 202, and a semiconductor top layer 203, the dielectric buried layer 202 being formed on the surface of the semiconductor body layer 201, the semiconductor top layer 203 being formed on the surface of the dielectric buried layer 202; and a hard mask layer 204 is formed on the surface of the semiconductor top layer 203.

In this embodiment of the present application, the material of the semiconductor body layer 201 is silicon. In other embodiments, the material of the semiconductor body layer 201 may be germanium or a combination of germanium and silicon.

The material of the dielectric buried layer 202 includes silicon oxide or a high dielectric constant material.

The material of the semiconductor top layer 203 includes silicon. In other embodiments, the material of the semiconductor top layer 203 may be germanium or a combination of germanium and silicon.

The thickness of the semiconductor top layer 203 is less than 12 nm.

The hard mask layer 204 is formed by superimposing a first silicon oxide layer and a second silicon nitride layer.

Figure 3B:
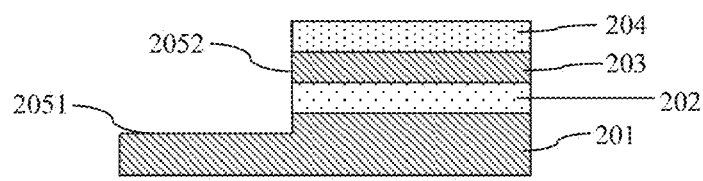

Step 2. Referring to FIG. 3B, a trench is formed in the entire hybrid region, wherein the hard mask layer 204, the semiconductor top layer 203, and the dielectric buried layer 202 in the trench are completely removed, the bottom surface 2051 of the trench is below or level with the top surface of the semiconductor body layer 201 and exposes the surface of the semiconductor body layer 201, and the side surface 2052 of the trench exposes the hard mask layer 204, the semiconductor top layer 203, the dielectric buried layer 202, and the semiconductor body layer 201 within the depth range of the trench.

In this embodiment of the present application, the hybrid region is defined by means of a photolithography process, the trench is formed by means of an etching process, the etching process of the trench completely removes the hard mask layer 204, the semiconductor top layer 203, and the dielectric buried layer 202 in the hybrid region, and the etching process of the trench does not etch or partially etches the semiconductor body layer 201. For example, when the bottom surface 2051 of the trench is level to the top surface of the semiconductor body layer 201, the etching process of the trench does not need to etch the semiconductor body layer 201; and when the bottom surface 2051 of the trench is lower than the top surface of the semiconductor body layer 201, the etching process of the trench needs to etch the semiconductor body layer 201.

Figure 3C:
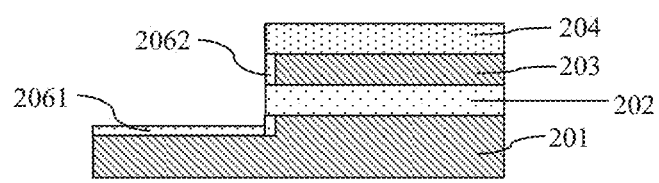

Step 3. Referring to FIG. 3C, oxidation is performed to form a first oxide layer on the exposed surfaces of the semiconductor body layer 201 and the semiconductor top layer 203, wherein the first oxide layer located on the bottom surface 2051 of the trench is separately marked with a mark 2061, and the first oxide layer located on the side surface 2052 of the trench is separately marked with a mark 2062.

Referring to FIG. 3C, since a region exposed at the bottom surface 2051 of the trench consists of the surface of the semiconductor body layer 201, the bottom surface 2051 of the trench may be completely oxidized. Only the side surface 2052 of the trench on the exposed surfaces of the semiconductor body layer 201 and the semiconductor top layer 203 is oxidized.

In this embodiment of the present application, the thickness of the formed first oxide layer is 10A-20A.

Figure 3D:
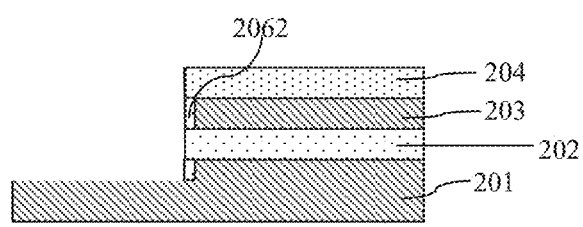

Step 4. Referring to FIG. 3D, the first oxide layer is fully etched to completely remove the first oxide layer 2061 on the bottom surface 2051 of the trench, and an inner sidewall composed of the remaining first oxide layer 2062 on the side surface 2052 of the trench in a self-aligned manner.

In this embodiment of the present application, the first oxide layer is fully etched by means of a dry etching process.

Figure 3E:
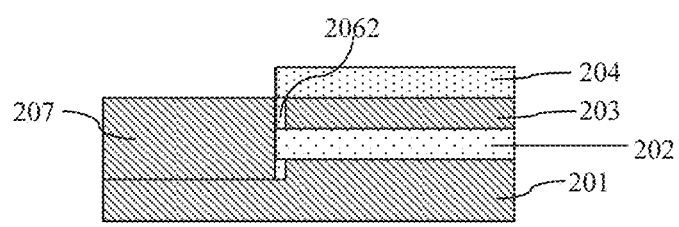

Step 5. Referring to FIG. 3E, epitaxial growth is performed to form, in the trench, a semiconductor epitaxial layer 207 in contact with the semiconductor body layer 201.

In this embodiment of the present application, the material of the semiconductor epitaxial layer 207 includes silicon. In other embodiments, the material of the semiconductor epitaxial layer 207 may be germanium or a combination of germanium and silicon.

After the epitaxial growth in step 5 is completed, the top surface of the semiconductor epitaxial layer 207 is level with the top surface of the semiconductor top layer 201. In an example, the epitaxial growth of the semiconductor epitaxial layer 207 is performed by means of an RPCVD process.

The surface of the semiconductor epitaxial layer 207 in the hybrid region is used to form a passive device or a pickup structure that needs to be connected to the semiconductor body layer 201.

The semiconductor top layer 203 outside the hybrid region is used to form a CMOS device. The CMOS device includes a PMOS device and an NMOS device. Since the semiconductor top layer 203 is an ultra-thin layer, the short channel effect of the PMOS device and the NMOS device can be improved, thus improving the performance of the PMOS device and the NMOS device.

In the present application, before the formation of the trench in the hybrid region and the epitaxial growth, an added oxidation process and a full etching process for the first oxide layer formed by the oxidation form the inner sidewall on the side surface 2052 of the trench. The inner sidewall can eliminate the growth of an epitaxial layer from the side surface of the semiconductor top layer 203 exposed in the trench, so as to ensure that the epitaxial growth occurs strictly from bottom to top, thereby eliminating a protrusion defect in the semiconductor epitaxial layer 207 at the boundary of the hybrid region and eventually improving the flatness of the surface of the semiconductor epitaxial layer 207.

In addition, the oxidation process oxidizes only the exposed semiconductor layers, so that the first oxide layer can be formed on the surfaces of the semiconductor top layer 203 and the semiconductor body layer 201 in a self-aligned manner and the thickness of the first oxide layer can be controlled to be very thin. In this case, the formed inner sidewall does not occupy an additional space and thus does not change the morphology of the semiconductor epitaxial layer 207, so that a bottom-to-top growth mode of the epitaxial growth is not affected. Therefore, the formation process for the inner sidewall in this embodiment of the present application does not produce new adverse effects on the epitaxial growth, eventually improving the overall process.

The present application is described in detail above via specific embodiments, which, however, are not intended to limit the present application. Without departing from the principles of the present application, those skilled in the art can also make many modifications and improvements, which should also be regarded as the protection scope of the present application.

What is claimed is:

1. An epitaxial growth method for a fully depleted semiconductor on insulator (FDSOI) hybrid region, comprising the following steps:

step 1, providing an FDSOI substrate structure, the FDSOI substrate structure comprising a semiconductor body layer, a dielectric buried layer, and a semiconductor top layer, the dielectric buried layer being formed on a surface of the semiconductor body layer, the semiconductor top layer being formed on the surface of the dielectric buried layer; and forming a hard mask layer on the surface of the semiconductor top layer, wherein the semiconductor body layer has a single crystal structure, the semiconductor top layer is an SOI layer, and the semiconductor top layer has a single crystal structure;

step 2, forming a trench in an entirety of the FDSOI hybrid region, wherein the hard mask layer, the semiconductor top layer, and the dielectric buried layer in the trench are completely removed, a bottom surface of the trench is below or level with a top surface of the semiconductor body layer and exposes the surface of the semiconductor body layer, and a side surface of the trench exposes the hard mask layer, the semiconductor top layer, the dielectric buried layer, and the semiconductor body layer within a depth range of the trench;

step 3, performing oxidation to form a first oxide layer on exposed surfaces of the semiconductor body layer and the semiconductor top layer, wherein the performing the oxidation oxidizes only the exposed semiconductor layers, so that the first oxide layer can be formed on the surfaces of the semiconductor top layer and the semiconductor body layer in a self-aligned manner and a thickness of the first oxide layer can be controlled;

step 4, fully etching the first oxide layer to completely remove the first oxide layer on the bottom surface of the trench, and forming an inner sidewall composed of a remaining first oxide layer on the side surface of the trench in a self-aligned manner, wherein the first oxide layer is fully etched by means of a dry etching process, wherein the side surface of the inner sidewall is self-aligned with a side surface of the hard mask layer exposed in the trench, and the inner sidewall does not occupy additional space; and step 5, performing epitaxial growth to form, in the trench, a semiconductor epitaxial layer in contact with the semiconductor body layer, wherein the epitaxial growth of the semiconductor epitaxial layer is performed by means of an RPCVD process.

2. The epitaxial growth method for the FDSOI hybrid region according to claim 1, wherein a material of the semiconductor body layer comprises silicon or germanium.

3. The epitaxial growth method for the FDSOI hybrid region according to claim 1, wherein a material of the dielectric buried layer comprises silicon oxide or a high dielectric constant material.

4. The epitaxial growth method for the FDSOI hybrid region according to claim 1, wherein a material of the semiconductor top layer comprises silicon or germanium.

5. The epitaxial growth method for the FDSOI hybrid region according to claim 1, wherein a material of the semiconductor epitaxial layer comprises silicon or germanium.

6. The epitaxial growth method for the FDSOI hybrid region according to claim 1, wherein the hard mask layer is formed by superimposing a first silicon oxide layer and a second silicon nitride layer.

7. The epitaxial growth method for the FDSOI hybrid region according to claim 1, wherein in step 2, the FDSOI hybrid region is defined by means of a photolithography process, the trench is formed by means of an etching process, the etching process of the trench completely removes the hard mask layer, the semiconductor top layer, and the dielectric buried layer in the FDSOI hybrid region, and the etching process of the trench does not etch or partially etches the semiconductor body layer.

8. The epitaxial growth method for the FDSOI hybrid region according to claim 1, wherein in step 3, the thickness of the first oxide layer is 10 Å-20 Å.

9. The epitaxial growth method for the FDSOI hybrid region according to claim 1, wherein a thickness of the semiconductor top layer is less than 12 nm.

10. The epitaxial growth method for the FDSOI hybrid region according to claim 1, wherein after the epitaxial growth in step 5 is completed, the top surface of the semiconductor epitaxial layer is level with the top surface of the semiconductor top layer.

11. The epitaxial growth method for the FDSOI hybrid region according to claim 1, wherein the surface of the semiconductor epitaxial layer in the FDSOI hybrid region is used to form a passive device or a pickup structure that needs to be connected to the semiconductor body layer.

12. The epitaxial growth method for the FDSOI hybrid region according to claim 1, wherein the semiconductor top layer outside the FDSOI hybrid region is used to form a CMOS device.

13. The epitaxial growth method for the FDSOI hybrid region according to claim 12, wherein the CMOS device comprises a PMOS device and an NMOS device.

* * * * *